United States Patent [19]
Kim et al.

[11] Patent Number: 5,939,131
[45] Date of Patent: Aug. 17, 1999

[54] METHODS FOR FORMING CAPACITORS INCLUDING RAPID THERMAL OXIDATION

[75] Inventors: Kyung-hoon Kim, Seoul; Kab-jin Nam, Kangwon-do; In-sung Park, Seoul; Young-wook Park, Kyungki-do, all of Rep. of Korea

[73] Assignee: Samsung Electronics Co., Ltd., Rep. of Korea

[21] Appl. No.: 08/874,614

[22] Filed: Jun. 13, 1997

[30] Foreign Application Priority Data

Jul. 23, 1996 [KR] Rep. of Korea .................. 1996-29883

[51] Int. Cl.⁶ ...................................... B05P 5/12
[52] U.S. Cl. .................... 427/81; 427/126.3; 427/376.1; 427/376.2; 427/419.3
[58] Field of Search .................................. 427/81, 126.3, 427/376.1, 376.2, 419.3

[56] References Cited

U.S. PATENT DOCUMENTS

| | | | |
|---|---|---|---|
| 4,621,277 | 11/1986 | Ito et al. ...................................... | 357/34 |
| 5,324,974 | 6/1994 | Liao ........................................ | 257/344 |
| 5,397,720 | 3/1995 | Kwong et al. ............................. | 437/40 |
| 5,464,783 | 7/1997 | Kim et al. ................................. | 437/42 |
| 5,517,047 | 5/1996 | Linn et al. ............................... | 257/347 |

OTHER PUBLICATIONS

Sun–Oo Kim and Hyeong Joon Kim, "The effects of substrate and annealing ambient of the electrical properties of Ta2O5 thin films prepared by plasma enhanced chemical vapor deposition," Thin Solid Films 253 (1994) 435–349.

M.M Farahani et al., "A study of Electrical, Metallurgical, and Mechanical Behaviors of Rapid Thermal Processed Ti films in NH3", J. Electrochem. Soc. vol. 141 No. 2, Feb. 1994, pp. 479–496.

G. Eftekhari, "MIS Diodes on n–InP with Tantalum Oxide Interfacial Layer Grown by Rapid Thermal Oxidation of Tantalum", phys. stat. sol. (a) 146, 867 (1994).

Youn Tae Kim and Chi Hoon Jun, "Effects of chlorine based gettering on the electrical properties of rapid thermal oxidation/nitridation dielectric films," J. Vac. Sci. Technol. A 11(4) Jul./Aug. 1993 pp. 1039–1043.

G.P. Burns, "Titanium dioxide dielectric films formed by rapid thermal oxidation", J. Appl. Phys. 65(5), Mar. 1, 1989, pp. 2095–2097.

*Primary Examiner*—Benjamin Utech
*Assistant Examiner*—Kin-chan Chen
*Attorney, Agent, or Firm*—Myers Bigel Sibley & Sajovec

[57] ABSTRACT

A method for forming a microelectronic capacitor includes the steps of forming a first conductive layer on a substrate and forming an oxide reducing layer on the first conductive layer opposite the substrate wherein the oxide reducing layer reduces oxidation of the first conductive layer. An oxide layer is formed on the oxide reducing layer opposite the substrate, and a dielectric layer is formed on the oxide layer opposite the substrate wherein the dielectric layer has a dielectric constant that is higher than a dielectric constant of the oxide reducing layer, and higher than a dielectric constant of the oxide layer. In addition, a second conductive layer is formed on the dielectric layer opposite the substrate. Related structures are also discussed.

11 Claims, 6 Drawing Sheets

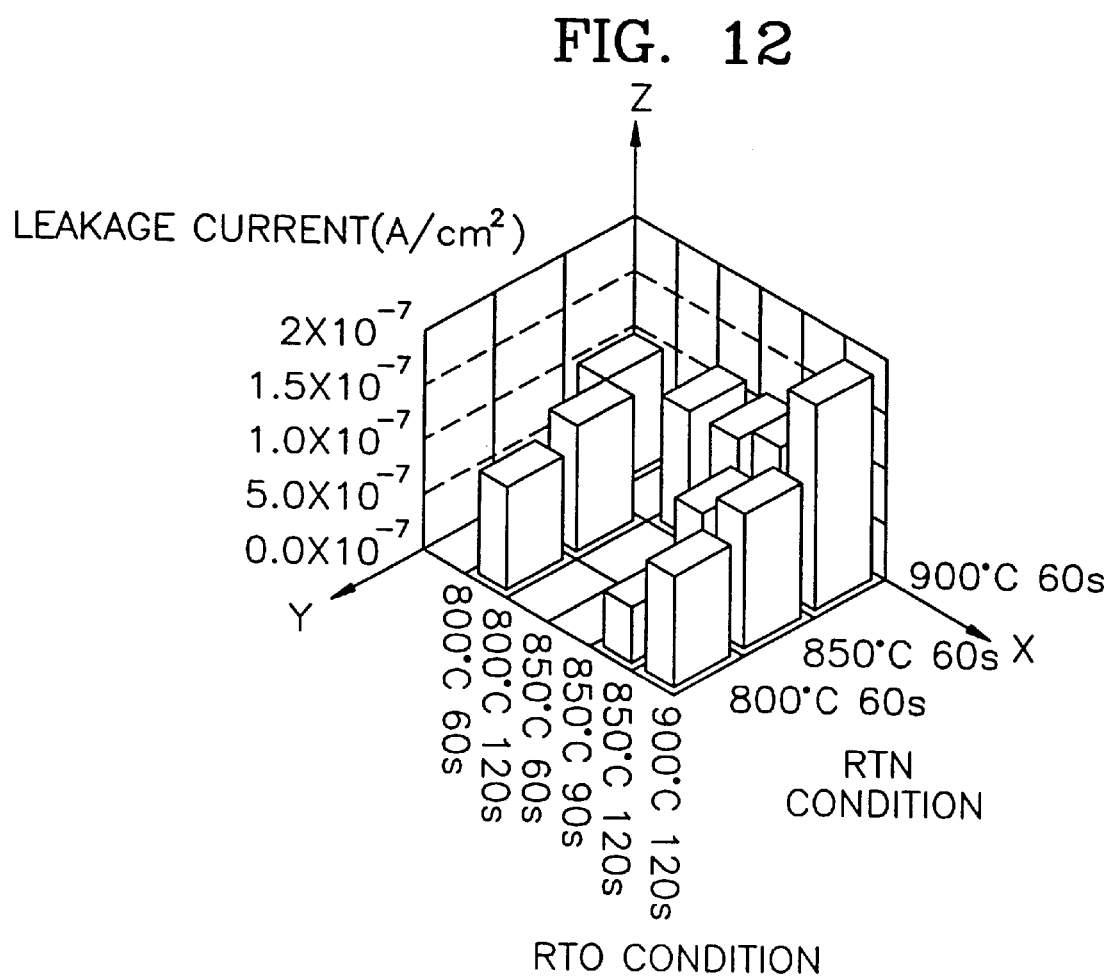

METHODS FOR FORMING CAPACITORS INCLUDING RAPID THERMAL OXIDATION

FIELD OF THE INVENTION

The present invention relates to the field of microelectronics and more particularly to methods for forming microelectronic capacitors.

BACKGROUND OF THE INVENTION

As semiconductor memory devices become more highly integrated, the size of a memory cell may be reduced. Accordingly, an area available for the memory cell capacitor and transistor is reduced. To maintain an adequate memory storage capacity, however, the capacitance for the memory cell capacitor should be maintained at an adequate level.

Various capacitor electrode structures have been suggested to maintain a desired memory cell capacitance in a smaller area. In particular, the surface area of the lower capacitor electrode has been increased by using three-dimensional structures such as cylinder or trench-type structures instead of the conventional planar electrode structure. These three-dimensional structures can thus provide an increased capacitance for a capacitor in a limited surface area of a substrate. Further increases in capacitance per unit area, however, may still be required.

Accordingly, research has been directed toward the identification of materials which can be used to form the lower electrode, the dielectric layer, and the upper electrode to further increase the capacitance per unit area of a memory cell capacitor. In particular, materials with relatively high dielectric constants have been investigated for use as the capacitor dielectric layer. For example, tantalum oxide ($Ta_2O_5$, hereinafter referred to as "TO") layers can be used to replace conventional nitride oxide (NO) layers while providing an increased dielectric constant.

A TO layer has a relatively high dielectric constant ($\epsilon$) when compared with a dielectric constant of silicon oxide ($SiO_2$) and silicon nitride ($Si_3N_4$). In particular, the dielectric constant of $SiO_2$ is approximately 3.9 and the dielectric constant of $Si_3N_4$ is approximately 7.8, while the dielectric constant of TO is approximately 24. In other words, the dielectric constant of a TO layer is approximately six times higher than the dielectric constant of a $SiO_2$ layer and about three times higher than the dielectric constant of a $Si_3N_4$ layer. Accordingly, a TO layer can be used to provide a dielectric layer having reduced equivalent oxide thickness ($T_{oxeq}$) when compared with $SiO_2$ or $Si_3N_4$.

A TO dielectric layer, however, may have an increased leakage current because the band gap of TO is narrower than the band gaps of $SiO_2$ and $Si_3N_4$. The leakage current of a TO dielectric layer is dependent on the method used to form the capacitor including the dielectric layer. Moreover, the leakage current of a To dielectric layer is dependent in part on steps performed both before and after the formation of the TO dielectric layer. When using a TO dielectric layer, the leakage current is influenced by the following factors: (1) the properties of an interface between the lower capacitor electrode and the TO dielectric layer; (2) a reaction between the lower electrode and the TO dielectric layer; (3) oxygen defects within the TO dielectric layer; and (4) the content of carbon compounds within the TO dielectric layer. More particularly, the leakage current increases with increasing reaction between the lower electrode and the TO dielectric layer, with increased oxygen defects within the TO dielectric layer, and with increasing content of carbon compounds within the TO dielectric layer.

The increased leakage current due to oxygen defects within the TO layer and the content of the carbon compounds can be reduced by heating the TO dielectric layer at a relatively high temperature in an atmosphere including oxygen after forming the TO dielectric layer. The high temperature heating step, however, may result in a relatively thick silicon oxide layer on a silicon lower electrode due to a reaction between the TO dielectric layer and the silicon of the lower electrode. A barrier layer on the lower electrode can be used to reduce the problem of the silicon oxide layer. The use of a barrier layer on the lower electrode, however, may cause additional problems as discussed below with regard to FIGS. 1 through 3.

As shown in FIG. 1, a conductive layer 14 is used as the lower electrode of the capacitor. This conductive layer 14 is formed on an interlayer dielectric layer (ILD) 12. In addition, a conductive plug 10 through the interlayer dielectric layer 12 provides an electrical connection between a semiconductor substrate and the lower capacitor electrode. Moreover, the conductive layer 14 is an in-situ doped polysilicon layer.

A nitride layer 16 is then formed on the conductive layer 14 using a rapid thermal nitridation (RTN) step, as shown in FIG. 2. The nitride layer 16 reduces oxidation of the conductive layer 14 when a high temperature oxidation step is performed after forming the dielectric layer such as a TO dielectric layer.

As shown in FIG. 3, a TO dielectric layer 18 is formed on the nitride layer 16. Moreover, the TO dielectric layer 18 can be stabilized using a high temperature step in an atmosphere including oxygen. The formation of silicon oxide on the conductive layer 14 is reduced because the nitride layer 16 covers the conductive layer 14. A TiN layer 19 is formed on the TO dielectric layer 18, and an in-situ doped polysilicon layer 20 is formed on the TiN layer 19. The polysilicon layer 20, the TiN layer 19, the TO dielectric layer 18, and the nitride layer 16 are then patterned to complete the capacitor structure.

According to the conventional method for forming a capacitor discussed above, the nitride layer 16 which is used to reduce the oxidation of the conductive layer 14 may include silicon atoms which do not form silicon-nitrogen couplings. Oxidation of the lower capacitor electrode (conductive layer 14) during a high temperature step using oxygen following the formation of the TO layer 18 can be reduced by the nitride layer 16. It may be difficult, however, to prevent the reaction between oxygen atoms within the TO dielectric layer 18 and silicon atoms of the nitride layer 16. The TO dielectric layer 18 may thus be degraded so that the leakage current is not sufficiently suppressed.

SUMMARY OF THE INVENTION

It is therefore an object of the present invention to provide methods for forming improved microelectronic capacitors and related structures.

It is another object of the present invention to provide methods for forming microelectronic capacitors having reduced leakage current and related structures.

It is still another object of the present invention to provide methods for forming microelectronic capacitors having a reduced equivalent oxide thickness and related structures.

These and other objects are provided according to the present invention by methods including the steps of forming a first conductive layer on a substrate, and forming an oxide reducing layer on the first conductive layer opposite the substrate. In particular, the oxide reducing layer reduces oxidation of the first conductive layer. An oxide layer is formed on the oxide reducing layer opposite the substrate, and a dielectric layer is formed on the oxide layer opposite the substrate. Moreover, the dielectric layer has a dielectric constant that is higher than a dielectric constant of the oxide reducing layer and higher than a dielectric constant of the oxide layer. A second conductive layer is formed on the dielectric layer opposite the substrate. Accordingly, deterioration of the dielectric layer during subsequent processing steps can be reduced, and a leakage current for the resulting capacitor can be reduced.

More particularly, the step of forming the oxide layer can include oxidizing the oxide reducing layer, and the step of forming the oxide layer can be a rapid thermal oxidation. Moreover, the rapid thermal oxidation can be performed at a temperature in the range of 800° C. to 900° C., and the rapid thermal oxidation can be performed in a RTP furnace including a vacuum load lock and/or a nitrogen purge.

According to an alternate aspect of the present invention, a microelectronic capacitor includes a first conductive layer on the substrate, and an oxide reducing layer on the first conductive layer opposite the substrate. In particular, the oxide reducing layer reduces oxidation of the first conductive layer. An oxide layer is provided on the oxide reducing layer opposite the substrate, and a dielectric layer is provided on the oxide layer opposite the substrate. Moreover, the dielectric layer has a dielectric constant that is higher than a dielectric constant of the oxide reducing layer, and higher than a dielectric constant of the oxide layer. A second conductive layer is then provided on the dielectric layer opposite the substrate to provide the second capacitor electrode.

According to the methods and structures of the present invention, the performance of a capacitor dielectric layer can be improved. More particularly, the equivalent oxide thickness can be reduced, and the leakage current can be reduced.

BRIEF DESCRIPTION OF THE DRAWINGS

FIG. 12 is a three-dimensional graph illustrating differences in the leakage current as a function of pre-treatment conditions according to the present invention.

DETAILED DESCRIPTION

Figure 1:
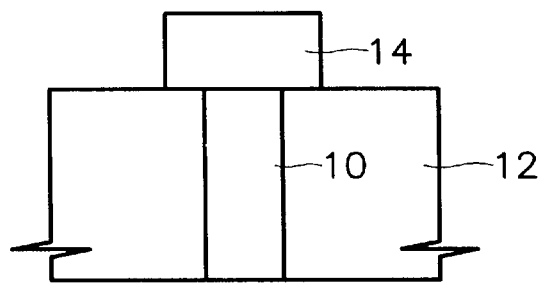
FIGS. 1, 2 and 3 are cross sectional views illustrating steps of a method for forming a capacitor of a semiconductor device according to the prior art.
Figure 2:
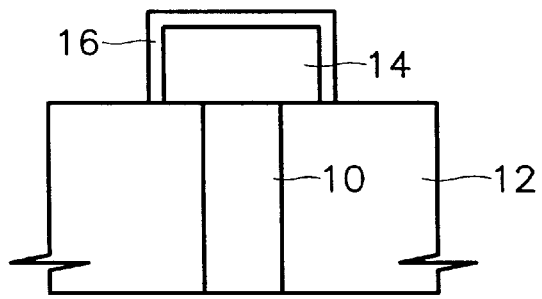
Figure 3:
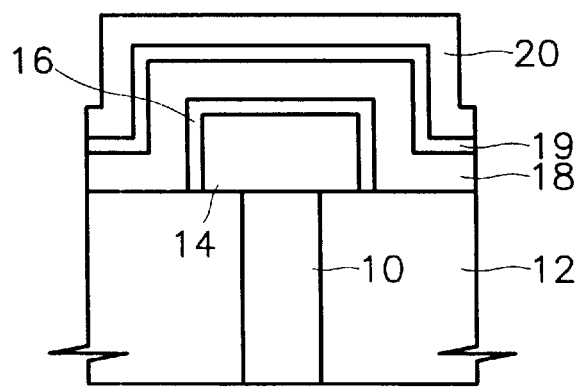

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 4:
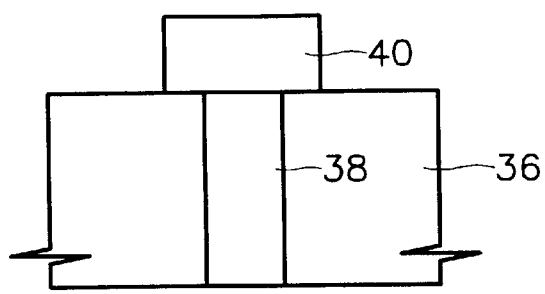
FIGS. 4, 5 and 6 are cross sectional views illustrating steps of a method for forming a capacitor of a semiconductor device according to the present invention.
Figure 5:
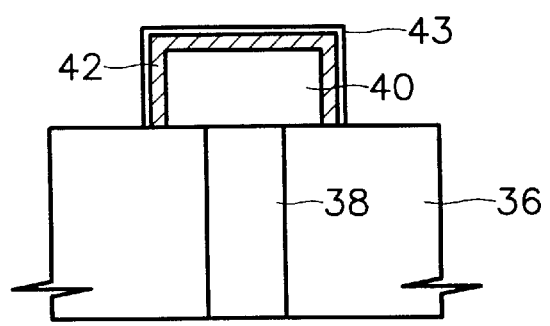
Figure 6:
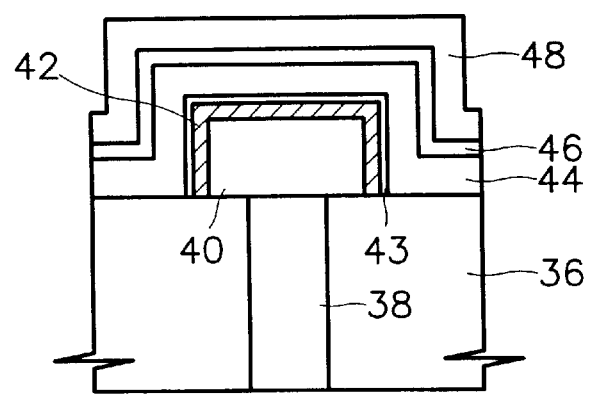

Referring to FIGS. 4 through 6, a method for forming a capacitor for a semiconductor device according to the present invention will be discussed. As shown in FIG. 4, a first conductive layer 40 is formed on an interlayer dielectric layer (ILD) 36. A conductive plug 38 through the interlayer dielectric layer provides an electrical connection between a semiconductor substrate and the first conductive layer 40. The first conductive layer 40 can be an in-situ doped polysilicon layer. In particular, the first conductive layer can be a layer of polysilicon doped with phosphorous, and the first conductive layer can be used to provide a lower capacitor electrode.

The first conductive layer 40 can be pre-treated using a rapid thermal nitridation (RTN) followed by a rapid thermal oxidation (RTO). In particular, the RTN step can be performed in a nitrogen atmosphere resulting in the formation of a nitride layer 42 on the first conductive layer 40. The nitride layer 42 thus provides an oxidation reducing layer on the first conductive layer 40. The RTN pre-treatment is preferably performed at a temperature in the range of 800° C. to 900° C., and more particularly at a temperature of approximately 850° C.

It is also preferable that the RTN pre-treatment be performed at a pressure of approximately 100 torr. The source gas used for the RTN pre-treatment can be selected from the group including ammonia ($NH_3$), dinitrogen oxide ($N_2O$), or nitrogen ($N_2$) Moreover, the source gas can be injected at a rate of 900 sccm for a period of time in the range of 10 seconds to 200 seconds, and preferably for approximately 120 seconds. The RTN pre-treatment is preferably performed in a rapid thermal processing (RTP) furnace, and the RTN pre-treatment may be performed in an apparatus including a vacuum load lock or a nitrogen purge.

The RTO pre-treatment is then performed. The RTO pre-treatment is preferably performed at a temperature in the range of 800° C. to 900° C., and more preferably at approximately 850° C. at a pressure of approximately 760 torr. This pressure is higher than that typically used for the RTN pre-treatment. In addition, 8 SLM of oxygen can be used as a source gas for the RTO pre-treatment. Moreover, the RTO pre-treatment is preferably performed for a period of time in the range of 10 seconds to 200 seconds, and more preferably for approximately 120 seconds. The RTO pre-treatment is preferably performed in an RTP furnace, and the RTO pre-treatment may be performed in an apparatus including a vacuum load lock and/or a nitrogen purge. Free silicon within the nitride layer 42 may thus be converted into a silicon oxide ($SiO_2$) layer 43 as a result of the RTO pre-treatment.

A dielectric layer 44 having a relatively high dielectric constant is formed on the nitride layer 42 as shown in FIG. 6. The dielectric layer 44 can be a TO dielectric layer having a thickness of approximately 120 Angstroms. The TO layer is formed using $T_a(OC_2H_5)_5$ as a reaction source using a metal organic chemical vapor deposition (MOCVD) technique in an oxygen atmosphere. An ultraviolet ray-ozone (UV-$O_3$) step and a dry oxidation step can be used to remove oxygen defects within the TO dielectric layer and to crystallize the TO dielectric layer. The UV-$O_3$ step is performed at approximately 300° C. for approximately 15 minutes, and the dry oxidation step is performed at approximately 800° C. for approximately 30 minutes.

A diffusion reducing layer 46 is then formed on the surface of the dielectric layer 44. The diffusion reducing layer 46 reduces a reaction between the high dielectric layer 44 and the upper capacitor electrode. The constituents of the diffusion reducing layer 46 preferably have a low oxygen transmittance and should not combine with oxygen. The diffusion reducing layer 46 is thus preferably formed of titanium nitride (TiN) using a sputtering technique.

The second conductive layer 48 is formed on the surface of the diffusion reducing layer 46, and this second conductive layer 48 provides an upper electrode for the capacitor. The second conductive layer 48 can be a layer of in-situ doped polysilicon, and phosphorous can be used as the doping material. The second conductive layer 48, the diffusion reducing layer 46, and the dielectric layer 44 can then be sequentially patterned to thereby complete the capacitor.

As discussed above, a pre-treatment is used prior to forming a TO dielectric layer of a capacitor to increase the performance thereof. More particularly, the first conductive layer 40 is pretreated using an RTN pre-treatment followed by an RTO pre-treatment. Accordingly, the equivalent oxide thickness of the TO dielectric layer can be reduced, and reactions between the TO dielectric layer and the lower electrode can be reduced. In addition, the leakage current characteristics for the TO dielectric layer can be improved when compared with the characteristics of a capacitor formed according to the prior art. The method of the present invention can thus be used to provide memory cell capacitors for highly integrated memory devices. The methods and structures of the present invention will now be discussed in more detail with regard to the following experiments.

EXPERIMENT 1

This experiment was executed to determine the change of the TO dielectric layer equivalent oxide thickness as a function of pre-treatment steps. After forming a first conductive layer on an interlayer dielectric layer including a conductive plug therein for connection to a semiconductor substrate, the substrate was loaded in a rapid thermal processing (RTN) furnace. The RTN pre-treatment was performed at approximately 900° C. for approximately 60 seconds in a nitrogen atmosphere. The RTO pre-treatment was then performed at approximately 850° C. for approximately 120 seconds in an oxygen atmosphere. A TO dielectric layer was then deposited on the first conductive layer. A control group was prepared using a conventional RTN pre-treatment. The experimental group discussed above was prepared using both the RTN pre-treatment and the RTO pre-treatment according to the present invention. The control group and the experimental group were then compared to clarify the effect of the pre-treatment of the present invention.

Figure 7:
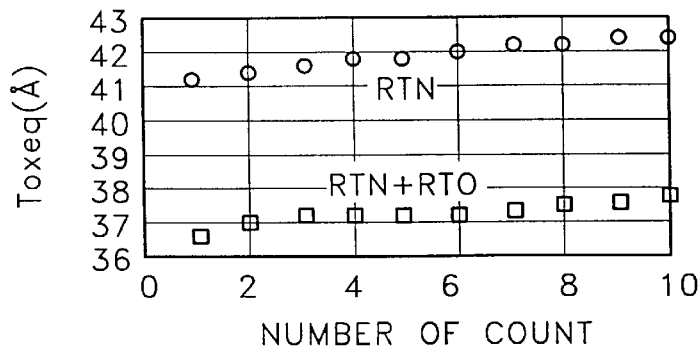
FIG. 7 is a graph illustrating the equivalent oxide thicknesses ($T_{oxeq}$) for dielectric layers formed according to the prior art and for dielectric layers formed according to the present invention.
Figure 8:
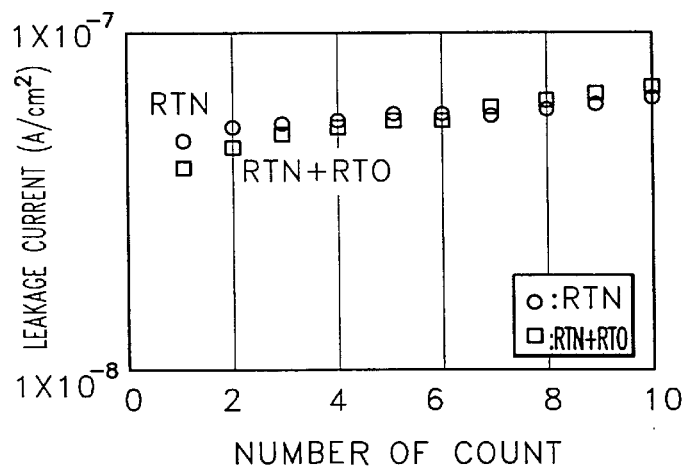
FIG. 8 is a graph illustrating a leakage current characteristic for capacitors formed according to the prior art and for capacitors formed according to the present invention.

Ten samples were selected from each of the experimental and control groups, and the equivalent oxide thickness ($T_{oxeq}$) of the TO dielectric layers was measured using ellipsometry. The results of the comparison are shown in FIG. 7. In addition, leakage current for each capacitor was measured, and the results of these measurements are shown in FIG. 8. In FIGS. 7 and 8, the squares represent data points from the experimental group, and circles represent data points measured from the control group.

As shown in FIG. 7, the equivalent oxide thicknesses of the TO dielectric layers of the experimental group were in the range of 37 Angstroms to 38 Angstroms, while the equivalent oxide thicknesses of the control group were in the range of 41 Angstroms to 42 Angstroms. The equivalent oxide thicknesses of the TO dielectric layers formed according to the present invention are thus 4 Angstroms to 5 Angstroms less than the equivalent oxide thickness of dielectric layers formed according to the prior art. As shown in FIG. 8, the leakage current characteristics of the capacitors formed using the method of the present invention were approximately the same as the leakage current characteristics of the capacitors formed using methods of the prior art.

Accordingly, the equivalent oxide thickness of a TO dielectric layer formed according to the present invention can be reduced by approximately 4 to 5 Angstroms when compared with that of the prior art, without significantly increasing the leakage current. As previously discussed, decreases in the equivalent oxide thickness have generally resulted in increased leakage currents. In contrast, the pre-treatment of the present invention allows a decrease in the equivalent oxide thickness without increasing leakage current.

EXPERIMENT 2

The second experiment was performed to determine whether a high temperature step used to stabilize and planarize a TO dielectric layer results in diffusion of silicon atoms from the first doped polysilicon conductive layer to the TO dielectric layer. Diffusion of silicon atoms may cause a reduction in the dielectric constant of the TO dielectric layer.

Figure 9:
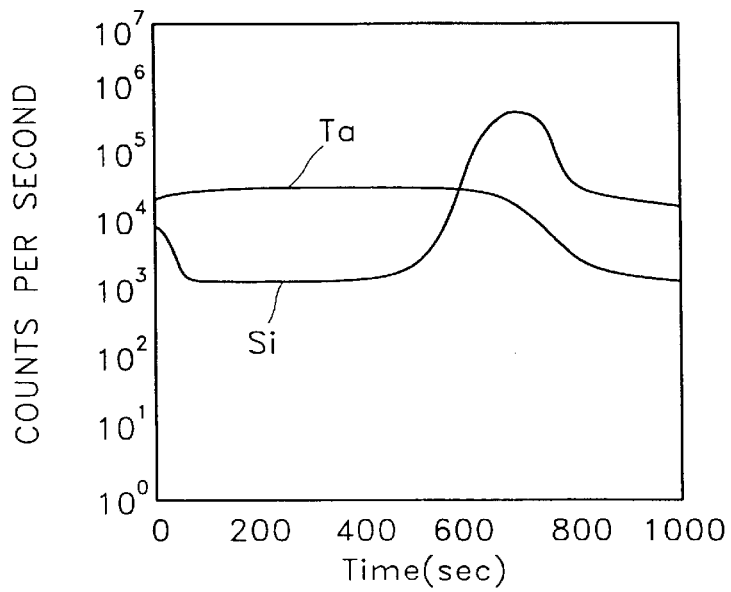
FIGS. 9 and 10 are graphs illustrating the distribution of silicon atoms within a dielectric layer formed according to the prior art and for a dielectric layer formed according to the present invention.

The first conductive layer was pre-treated using both the RTN pre-treatment and the RTO pre-treatment, and the TO dielectric layer was then formed on the pre-treated first conductive layer as discussed above with regard to Experiment 1. The structure was then heated to a relatively high temperature for a predetermined period of time in an oxygen atmosphere. The concentrations of silicon atoms and tantalum atoms within the TO dielectric layer were measured using a secondary ion mass spectroscopy (SIMS) technique, and the results of the measurements of the experimental group are shown in FIG. 9. In addition, the results of measurements of a control group which were measured using the SIMS technique and which were prepared without the RTO pre-treatment step are shown in FIG. 10.

Figure 10:
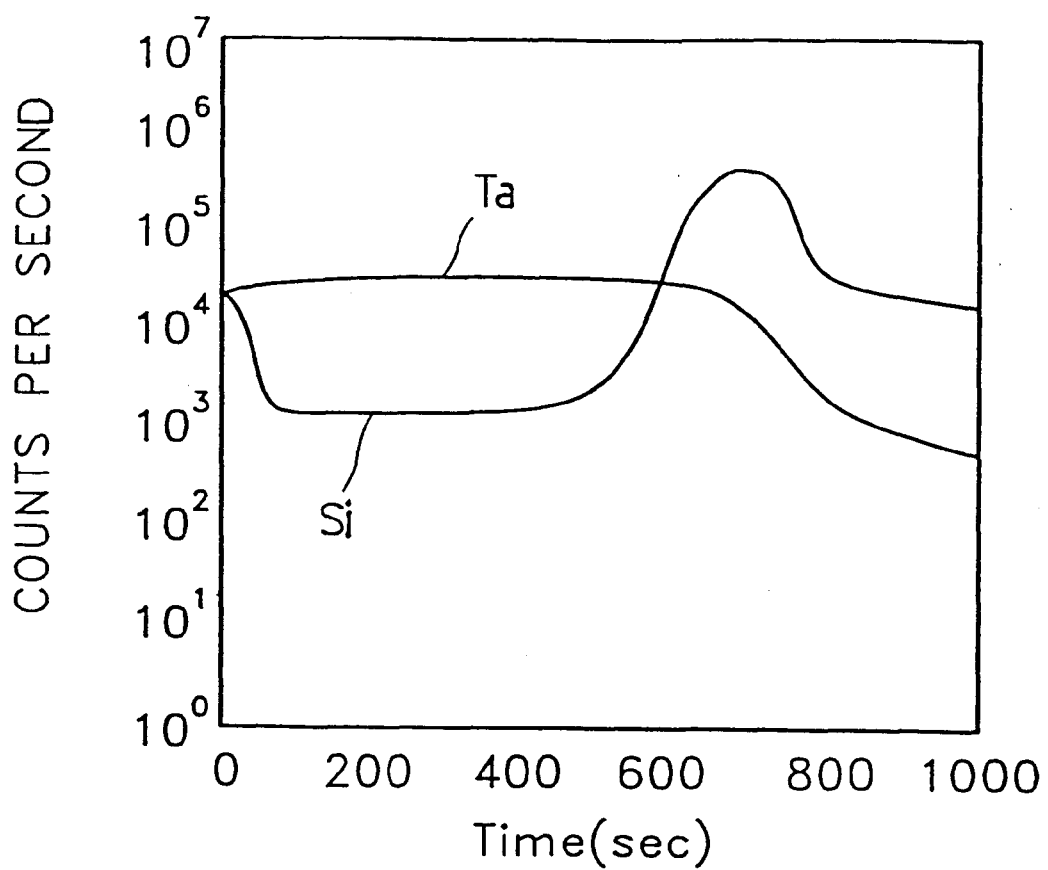

In FIGS. 9 and 10, the curve designated Si represents the change of silicon concentration within the TO dielectric layer, and a curve designated Ta represents the change of tantalum concentration within the TO dielectric layer. As shown in FIGS. 9 and 10, the silicon concentration within the TO dielectric layer was the same regardless of the pre-treatment used. Accordingly, it can be inferred that the silicon atoms diffused from the first conductive layer into the TO dielectric layer may react with the TO dielectric layer to form another material instead of remaining as a solid solution within the TO dielectric layer. Accordingly, various reactions which may occur between the silicon atoms and the TO layer and the corresponding reaction energies for each reaction were examined to determine if this inference is correct. The reactions which may occur within the TO dielectric layer are expressed in the reaction formulas listed as follows;

$$Si + O_2 = SiO_2 \tag{1}$$

$$1/3(Si_3N_4) + O_2 = SiO_2 + 2/3(N_2) \tag{2}$$

$$4/10(Ta_2O_5) + Si = 4/5(Ta) + SiO_2 \tag{3}$$

$$Ta_2O_5 + Si_3N_4 = 2Ta + Si + SiO_2 + 2N_2 + 3/2(O_2) \tag{4}$$

$$5/6(Ta_2O_5) + SiO_2 = 1/3(TaSi_2) + 31/6(O_2) \tag{5}$$

Considering the reaction energies of each of the above formulas, it can be shown that the TO dielectric layer can react with silicon atoms relatively easily. In other words, after the formation of the TO dielectric layer, silicon atoms from the first conductive layer may diffuse into the TO dielectric layer during the heating process to react with the TO dielectric layer rather than remain as a solid solution therein. Accordingly, the results measured using the SIMS technique are approximately the same for the experimental group in FIG. 9 as for the control group of FIG. 10 despite the different pretreatment steps.

EXPERIMENT 3

Because the TO dielectric layer is formed using a $Ta(OC_2H_5)_5$ as a source gas in an oxygen atmosphere using the MOCVD technique, an absorption rate may differ according to the surface states of the first conductive layers. Accordingly, this third experiment was performed to examine differences in absorption rates between the surface of the first conductive layer having the RTN pre-treatment and the RTO pre-treatment with the surface of the first conductive layer having only the RTN pre-treatment.

After forming the conductive layer to be used as the lower electrode of a capacitor on first and second semiconductor substrates as discussed above with regard to the first and second experiments, the first conductive layer was pre-treated using both the RTN pre-treatment and the RTO pre-treatment to provide the experimental structure. The second conductive layer was pre-treated using only the RTN pre-treatment to provide the control structure. The TO dielectric layer was then formed on the nitride layers of each structure using the same deposition conditions. The thickness of the TO dielectric layers was then measured using a transmission electron microscope (X-TEM).

The thickness of the TO dielectric layer of the experimental structure formed according to the present invention was approximately 87 Angstroms, and the thickness of the TO dielectric layer of the control structure formed according to the prior art was approximately 117 Angstroms. The thickness of the TO dielectric layer of the experimental structure formed according to the present invention is less than the thickness of the TO dielectric layer of the control structure by approximately 30 Angstroms. In other words, the absorption rate was slower in the experimental structure than in the control structure.

The difference in absorption rates may be caused by the state of the interface formed between the first conductive layer and the TO dielectric layer. In other words, both an oxynitride(SiON) layer and a silicon oxide ($SiO_2$) layer are formed on the first conductive layer of the experimental structure which was subject to both the RTN pre-treatment and the RTO pre-treatment while the first conductive layer of the control structure was pre-treated using only the RTN pre-treatment resulting in only a nitride layer on the first conductive layer. The combination of the oxynitride layer and the silicon oxide layer thus lowers the absorption rate in the experimental structure. As a result, the TO dielectric layer of the experimental structure was thinner than that of the control structure.

EXPERIMENT 4

Differences in the equivalent oxide thickness ($T_{oxeq}$) and leakage current characteristics of the TO dielectric layers with respect to the temperature and times for the RTN and RTO pre-treatments will be discussed with regard to the following experiment. In particular, a plurality of semiconductor substrates, each having a first conductive layer providing a lower electrode of a capacitor, were classified into three groups, A, B, and C. Each of the substrates was subject to a RTN pre-treatment for approximately 60 seconds. The substrates of group A were subject to the RTN pre-treatment at a temperature of approximately 800° C., the substrates of group B were subjected to the RTN pre-treatment at a temperature of approximately 850° C., and the substrates of group C were subjected to the RTN pre-treatment at a temperature of approximately 900° C.

Each of the substrate groups was then divided into respective sub-groups, and each sub-group was subjected to a different RTO pre-treatment. In particular, each sub-group from each of the groups was subjected to one of the following RTO pre-treatments: a RTO pre-treatment at approximately 800° C. for approximately 60 seconds; a RTO pre-treatment at approximately 800° C. for approximately 120 seconds; a RTO pre-treatment at approximately 850° C. for approximately 60 seconds; a RTO pre-treatment at approximately 850° C. for approximately 90 seconds; a RTO pre-treatment at approximately 850° C. for approximately 120 seconds; and a RTO pre-treatment at approximately 900° C. for approximately 120 seconds.

Figure 11:
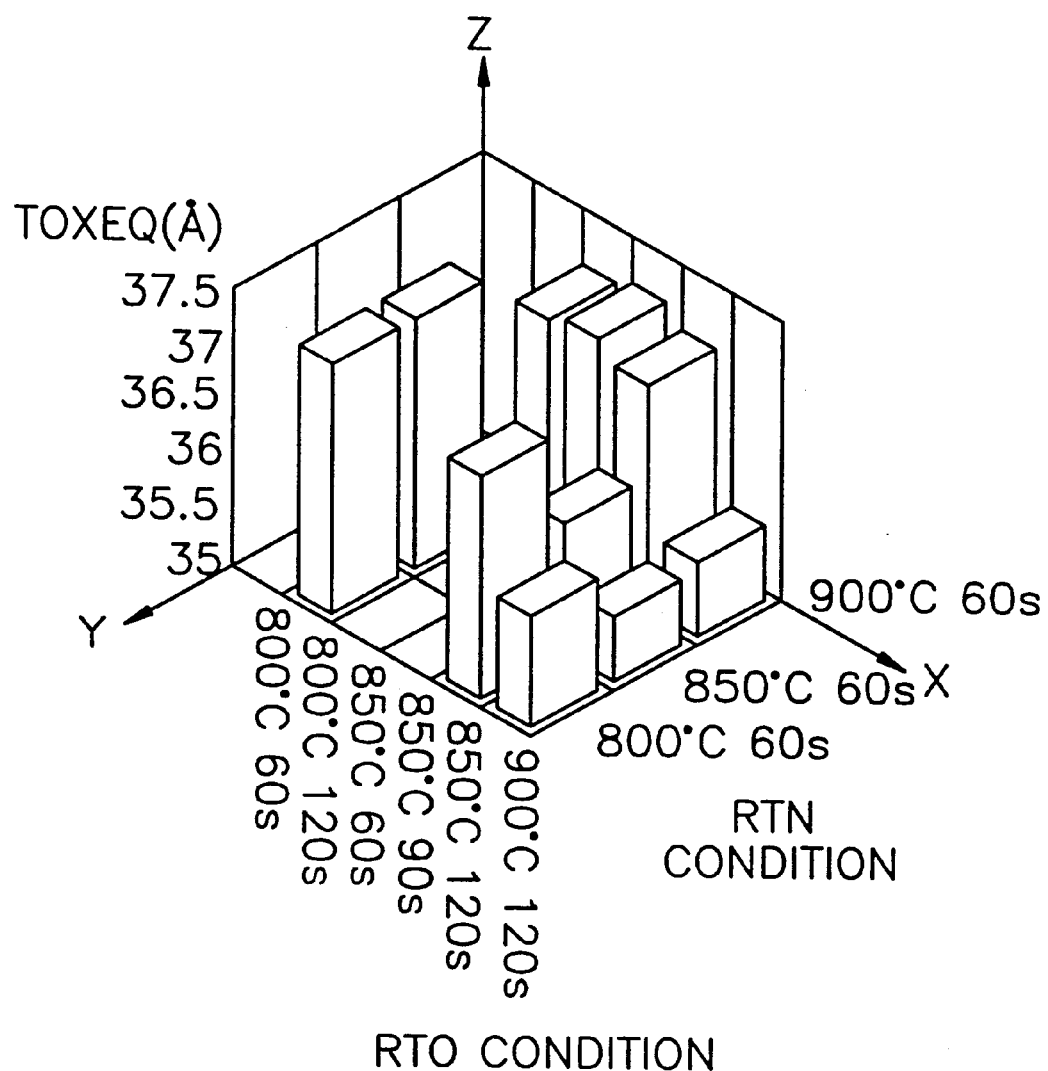
FIG. 11 is a three-dimensional graph illustrating differences in the equivalent oxide thickness ($T_{oxeq}$) as a function of pre-treatment conditions according to the present invention.

After forming each of the TO dielectric layers using the different pre-treatments discussed above, the equivalent oxide thickness ($T_{oxeq}$) and leakage current characteristics for each TO dielectric layer were measured, and the results are shown in FIGS. 11 and 12. In each of FIGS. 11 and 12, the RTO pre-treatment is identified along the X-axis, and the RTN pre-treatment is identified along the Y-axis. In FIG. 11, the equivalent oxide thickness ($T_{oxeq}$) is identified along the Z-axis. In FIG. 12, the leakage current is identified along the Z-axis.

As shown in FIG. 11, the equivalent oxide thickness ($T_{oxeq}$) of the TO dielectric layer decreases as the temperature and time increase for the RTO pre-treatment. The equivalent oxide thickness ($T_{oxeq}$) of the TO dielectric layer, however, does not appear to have a significant dependence on the RTN pre-treatment used. The applicants theorize that this lack of dependence results because silicones within the silicon nitride layer formed during the RTN pre-treatment are changed into a silicon oxide layer during the RTO pre-treatment and by the silicon oxide layer interface between the first conductive layer and the TO dielectric layer formed by the following high-temperature step is stabilized.

As the temperature and time of the RTO pre-treatment increase, the thickness of the silicon oxide layer increases thereby increasing the stability of the interface. Accordingly, the equivalent oxide thickness ($T_{oxeq}$) is reduced. As shown in FIG. 12, the leakage current does not appear to have a significant dependence on the RTO pre-treatment used. The leakage current, however, decreases as the temperature of the RTN pre-treatment decreases.

As discussed above, a TO dielectric layer can be used to provide a dielectric layer for a capacitor according to methods of the present invention. In particular, the relatively high dielectric constant of a TO dielectric layer can be used to increase the capacitance of an integrated circuit capacitor used in integrated circuit memory device. In addition, the lower electrode of the capacitor formed according to the present invention is pre-treated with both RTN and RTO pre-treatments before forming the TO dielectric layer. A reaction between the RTO dielectric layer and an interface between the lower electrode and the TO dielectric layer can thus be reduced during the heating steps following the formation of the TO dielectric layer. As a result, a dielectric layer for a capacitor can be provided having a relatively stable leakage current characteristic and which has a lower equivalent oxide thickness when compared with a conventional dielectric layer.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a microelectronic capacitor, said method comprising the steps of:

forming a first conductive layer on a substrate;

forming nitride layer on said first conductive layer opposite said substrate wherein said nitride layer reduces oxidation of said first conductive layer and wherein said nitride layer and said first conductive layer comprise different materials;

forming an oxide layer on said nitride layer opposite said substrate;

forming a dielectric layer on said oxide layer opposite said substrate wherein the dielectric constant of said dielectric layer is higher than the dielectric constant of said nitride layer, and higher than the dielectric constant of said oxide layer;

exposing said dielectric layer to ultraviolet rays and ozone;

oxidizing said dielectric layer in the absence of water;

after exposing the dielectric layer to ultraviolet rays and ozone and after oxidizing said dielectric layer in the absence of water, forming a titanium nitride layer on said dielectric layer opposite said substrate; and after forming said titanium nitride layer on said dielectric layer opposite said substrate, forming a second conductive layer on said dielectric layer opposite said substrate.

2. The method according to claim 1 wherein said step of forming said oxide layer comprises oxidizing a surface portion of said nitride layer opposite said first conductive layer.

3. The method according to claim 2 wherein said step of forming said oxide layer comprises a rapid thermal oxidation.

4. The method according to claim 3 wherein said rapid thermal oxidation is performed at a temperature in the range of 800° C. to 900° C.

5. The method according to claim 3 wherein said rapid thermal oxidation is performed in a RTP furnace.

6. The method according to claim 1 wherein said dielectric layer comprises a layer of tantalum oxide.

7. The method according to claim 1 wherein said step of forming said nitride layer comprises performing a rapid thermal nitridation.

8. The method according to claim 7 wherein said rapid thermal nitridation is performed at a temperature in the range of 800° C. to 900° C.

9. The method according to claim 8 wherein said rapid thermal nitridation is performed for a period of time in the range of 10 seconds to 200 seconds.

10. The method according to claim 1 wherein said nitride layer is formed using a gas including a mixture of nitrogen and ammonia.

11. The method according to claim 1 wherein said step of forming said first conductive layer comprises forming a first doped polysilicon layer, and wherein said step of forming said second conductive layer comprises forming a second doped polysilicon layer.

\* \* \* \* \*